United States Patent
Nakagawa

(10) Patent No.: US 11,408,928 B2
(45) Date of Patent: Aug. 9, 2022

(54) STATE OUTPUT CIRCUIT AND POWER SUPPLY APPARATUS

(71) Applicant: FUJI ELECTRIC CO., LTD., Kanagawa (JP)

(72) Inventor: Sho Nakagawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 164 days.

(21) Appl. No.: 17/001,685

(22) Filed: Aug. 25, 2020

(65) Prior Publication Data
US 2021/0080499 A1    Mar. 18, 2021

(30) Foreign Application Priority Data

Sep. 17, 2019    (JP) .............................. JP2019-168157

(51) Int. Cl.
   *G01R 31/40*    (2020.01)
   *G01R 31/28*    (2006.01)
   *H02M 1/32*     (2007.01)
   *G01R 31/317*   (2006.01)
   *H02M 1/00*     (2006.01)

(52) U.S. Cl.
   CPC ... *G01R 31/2839* (2013.01); *G01R 31/31721* (2013.01); *G01R 31/40* (2013.01); *H02M 1/32* (2013.01); *H02M 1/0003* (2021.05)

(58) Field of Classification Search
   CPC .... G01R 31/40; G01R 31/42; G01R 31/2836; G01R 31/2839; G01R 31/2851; G01R 31/31721; H02M 1/32; H02M 1/0003; H02M 1/0022; H02M 1/0035
   See application file for complete search history.

(56) References Cited

U.S. PATENT DOCUMENTS

| 10,115,251 B2 | 10/2018 | Soma |
| 2004/0264091 A1* | 12/2004 | Ishida .................. H02J 7/0063 361/93.1 |
| 2007/0024288 A1* | 2/2007 | Hu ..................... H02M 3/33507 324/547 |
| 2016/0265501 A1* | 9/2016 | Miyazawa ............ F02P 3/0552 |
| 2017/0201075 A1* | 7/2017 | Miyazawa ............. H01T 15/00 |

FOREIGN PATENT DOCUMENTS

JP    2017005125 A    1/2017

OTHER PUBLICATIONS

Morisawa, et al., High-Side 2-in-1 IPS "F5114H" for Automobiles (Fuji Electric Review vol. 62—No. 4, 2016), p. 261-264.

* cited by examiner

*Primary Examiner* — Thang X Le

(57) ABSTRACT

A state output circuit that outputs a state signal indicating a state of a power supply apparatus, including: a state output terminal that outputs the state signal; a reference potential line to which a reference potential is applied; a first pull-up terminal to which a first pull-up potential is applied, wherein the first pull-up potential is a potential higher than the reference potential; a connection switch unit that is provided between the state output terminal and the reference potential line, and switches whether to connect the state output terminal to the reference potential line or not, in accordance with the state of the power supply apparatus; a first protection resistor provided between the connection switch unit and the state output terminal; and a pull-up unit that pulls up a first connection line between the first protection resistor and the connection switch unit up to the first pull-up potential.

15 Claims, 7 Drawing Sheets

STATE OUTPUT CIRCUIT AND POWER SUPPLY APPARATUS

The contents of the following Japanese patent application are incorporated herein by reference: No. 2019-168157 filed in JP on Sep. 17, 2019.

BACKGROUND

1. Technical Field

The present invention relates to a state output circuit and a power supply apparatus.

2. Related Art

Conventionally, in a power supply apparatus which supplies power to a load, a configuration is known to output a state signal which indicates a state of the power supply apparatus, such as an overcurrent and an overheat (see Patent document 1, for example).

Patent document 1: Japanese Patent Application Publication No. 2017-5125

In the power supply apparatus, it is preferable to protect a state output terminal which outputs the state signal.

SUMMARY

In order to solve the problem mentioned above, in the first aspect of the present invention, provided is a state output circuit that outputs a state signal indicating a state of the power supply apparatus. The state output circuit may include a state output terminal that outputs the state signal. The state output circuit may include a reference potential line to which a reference potential is applied. The state output circuit may include a first pull-up terminal to which a first pull-up potential is applied, wherein the first pull-up potential is a potential higher than the reference potential. The state output circuit may include a connection switch unit that is provided between the state output terminal and the reference potential line, and switches whether to connect the state output terminal to the reference potential line or not, in accordance with the state signal. The state output circuit may include a first protection resistor provided between the connection switch unit and the state output terminal. The state output circuit may include a pull-up unit that pulls up a first connection line between the first protection resistor and the connection switch unit up to the first pull-up potential.

A resistance value of the first protection resistor may be 1 kΩ or more.

The state output circuit may include a first protection diode that includes an anode connected to the reference potential line and a cathode connected to the first connection line.

The pull-up unit may include a pull-up resistor provided between the first connection line and the first pull-up terminal.

A resistance value of the pull-up resistor may be 10 kΩ or more.

The pull-up resistor may be an MOSFET of a depletion type that includes a gate terminal and a source terminal connected to each other.

The state output circuit may include a control unit that controls the connection switch unit in accordance with the state of the power supply apparatus. The state output circuit may include a power supply terminal that supplies power of a power source to the control unit. The power supply terminal and the first pull-up terminal may be the same terminal. The power supply terminal may be a terminal different from the first pull-up terminal.

The state output circuit may include a second pull-up terminal to which a second pull-up potential is applied. The pull-up unit may pull up the first connection line up to a potential in accordance with the first pull-up potential or the second pull-up potential.

The pull-up unit may pull up the first connection line up to a potential in accordance with the first pull-up potential, if the second pull-up terminal is in an open state. The pull-up unit may pull up the first connection line up to a potential in accordance with the second pull-up potential, if an external power source is connected to the second pull-up terminal.

The pull-up unit may include a potential generating MOSFET that is provided between the first pull-up terminal and the second pull-up terminal, and the first connection line, and generates a potential in accordance with the first pull-up potential or the second pull-up potential. The pull-up unit may include a first connection unit that connects the first pull-up terminal to a gate terminal of the potential generating MOSFET. The pull-up unit may include a second connection unit that connects the second pull-up terminal to a gate terminal of the potential generating MOSFET. The second connection unit may include a second protection resistor provided between the second pull-up terminal and a gate terminal of the potential generating MOSFET.

A resistance value of the second protection resistor may be 1 kΩ or more.

The first connection unit may include a clamping diode provided between the first pull-up terminal and the reference potential line. The first connection unit may include a first serial resistor provided between the clamping diode and the first pull-up terminal. The first connection unit may include a second serial resistor provided between the first serial resistor and the first pull-up terminal. A second connection line between the first serial resistor and the second serial resistor may be connected to a gate terminal of the potential generating MOSFET.

The pull-up unit may include a second protection diode including an anode connected to a source terminal of the potential generating MOSFET and a cathode connected to a gate terminal of the potential generating MOSFET.

In the second aspect of the present invention, provided is a power supply apparatus that supplies power to a load. The power supply apparatus may include a control unit that detects a state of the power supply apparatus. The power supply apparatus may include the state output circuit according to the first aspect that outputs a state signal indicating a state of the power supply apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through the embodiment of the invention. However, the following embodiments are not to limit the claimed invention. In addition, all of the combinations of the features described in the embodiment are not necessarily required for the solution of the invention.

Figure 1:
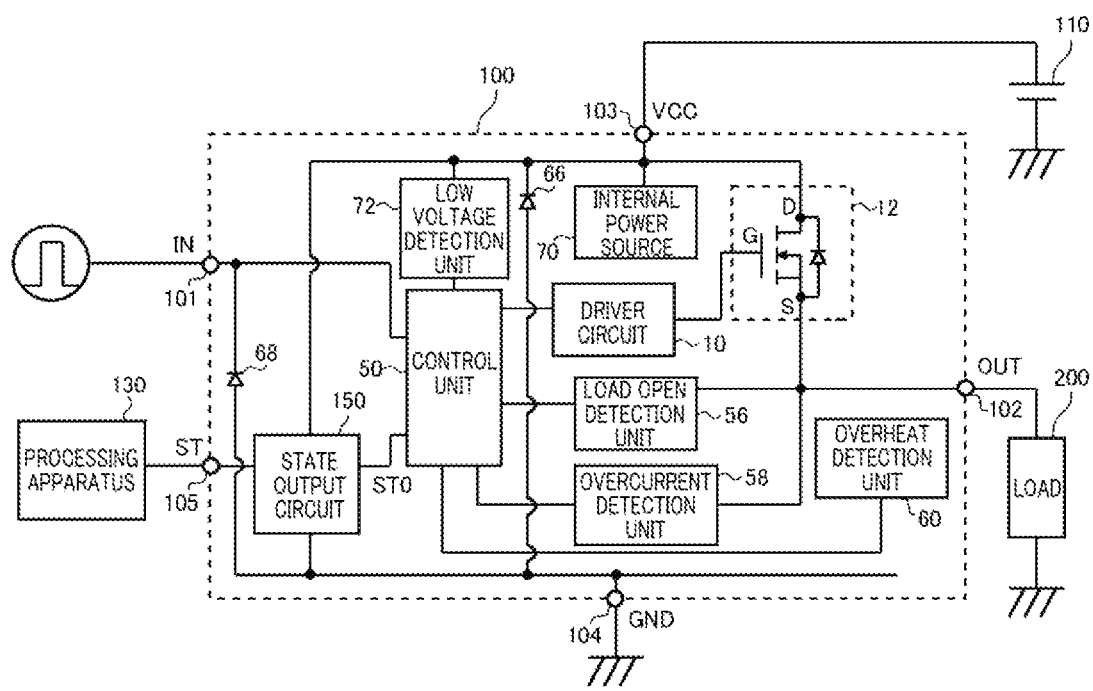
FIG. 1 is a diagram illustrating one example of a power supply apparatus 100 according to one embodiment of the present invention.

FIG. 1 is a diagram illustrating one example of a power supply apparatus 100 according to one embodiment of the present invention. The power supply apparatus 100 of the present example is a semiconductor chip including an input terminal 101, an output terminal 102, a high potential terminal 103, a reference potential terminal 104 and a state output terminal 105.

The power supply apparatus 100 operates in accordance with an input signal IN input to the input terminal 101 to supply power to a load 200 connected to the output terminal 102. The input signal IN of the present example may be a signal of a binary logic value which indicates whether to supply power to the load 200 or not.

A predetermined high potential VCC is applied to the high potential terminal 103. A power source 110 is connected to the high potential terminal 103 of the present example which generates the high potential VCC. A reference potential is applied the reference potential terminal 104, where the reference potential is lower than the high potential VCC. The reference potential of the present example is a ground potential GND.

The power supply apparatus 100 outputs from the state output terminal 105 a state signal ST which indicates an internal state of the power supply apparatus 100. The state signal ST may be a signal, for example, which indicates that an anomaly such as an overcurrent is detected. A processing apparatus 130 which processes the state signal ST may be connected to the state output terminal 105. The processing apparatus 130 and the power supply apparatus 100 may be provided in the same chip package. The processing apparatus 130 may be a dedicated apparatus to process the state signal ST, or may also be a general purpose apparatus. The processing apparatus 130 may control the power supply apparatus 100, may control another power supply apparatus 100, and may also control other apparatuses, in accordance with the state signal ST. For example, the processing apparatus 130 is connected to a plurality of power supply apparatuses 100 and stops power supply from the plurality of power supply apparatuses 100 if an anomaly is detected in any of the power supply apparatuses 100. In addition, if an anomaly is detected in any of the power supply apparatuses 100, the processing apparatus 130 may cause the other apparatuses to alert or may also stop the other apparatuses.

The power supply apparatus 100 may include a driver circuit 10 and an output unit 12. The output unit 12 is connected to load 200 via the output terminal 102 to supply power to the load 200. The output unit 12 may be a switching device such as an IGBT or a power MOSFET. The output unit 12 includes a control terminal G (gate terminal, for example), source terminal S and a drain terminal D. The drain terminal D of the present example is connected to the high potential terminal 103 and the source terminal S is connected to the output terminal 102. The output unit 12 switches whether to apply the high potential VCC to the load 200 or not, in accordance with a difference between a potential of a control signal input to the control terminal G and a potential of the source terminal S.

The driver circuit 10 inputs to the control terminal G of the output unit 12 a control signal in accordance with the input signal IN input to the input terminal 101. A signal is input to the driver circuit 10, where the signal has a potential which refers to the reference potential GND as a reference. The driver circuit 10 functions as a level shift circuit which performs a level shift on a signal which refers to the reference potential GND as a reference to a control signal which refers to an output potential OUT of the output unit 12 as a reference. The output potential OUT may be a potential of the source terminal S of the output unit 12.

The power supply apparatus 100 of the present example includes a control unit 50. The control unit 50 inputs to the driver circuit 10 a control signal having a pattern of a logic value in accordance with the input signal IN. The control signal output by the control unit 50 represents a potential in accordance with the reference potential GND if it is a logic value L and represents a potential in accordance with the high potential VCC if it is a logic value H. The potential in accordance with the reference potential GND may be a potential approximately equal to the reference potential GND. The potential in accordance with the high potential VCC may be a potential approximately equal to the high potential VCC.

The control unit 50 of the present example controls the driver circuit 10 based on an internal state of the power supply apparatus 100. The internal state of the power supply apparatus 100 may be a state indicated by at least one parameter from among a voltage value, a current value and a resistance value in a predetermined node, and a temperature at a predetermined location. The power supply apparatus 100 of the present example includes at least one of a low voltage detection unit 72, a load open detection unit 56, an overcurrent detection unit 58 and an overheat detection unit 60, each of which monitors the internal state of the power supply apparatus 100.

The low voltage detection unit 72 detects a voltage value of the high potential VCC of the high potential terminal 103. The low voltage detection unit 72 notifies the control unit 50 that an anomalous state is detected if the voltage value of the high potential VCC falls below a predetermined reference value.

The load open detection unit 56 detects whether the load 200 is connected to the output terminal 102 or not. The load open detection unit 56 may detect whether the output terminal 102 is in an open state or not, based on an output resistor if a predetermined voltage or current is output from the output terminal 102. In order to prevent the output unit 12 from turning to an ON state when the load 200 is not connected to the output terminal 102, the load open detection unit 56 notifies the control unit 50 that the anomalous state is detected, if it detects that the load 200 is not connected.

The overcurrent detection unit 58 detects a current output from the output unit 12. The overcurrent detection unit 58 notifies the control unit 50 that an anomalous state is detected if the output current value exceeds a predetermined reference value.

The overheat detection unit 60 detects a temperature at one or more locations of the power supply apparatus 100. The overheat detection unit 60 notifies the control unit 50 that an anomalous state is detected if a temperature at any of locations exceeds a predetermined reference value.

The control unit 50 controls the output unit 12 to be in an OFF state if it is notified by any of the detection units that the anomalous state is detected, irrespective of the logic value of the input signal IN. The power supply apparatus 100 can be protected by turning the output unit 12 into the OFF state in accordance with the internal state of the power supply apparatus 100.

The power supply apparatus 100 includes a state output circuit 150. The control unit 50 causes the state output circuit 150 to output the state signal ST of a predetermined logic value, if it is notified by any of the detection units that the anomalous state is detected. The state output circuit 150 of the present example may include an MOSFET connected between the state output terminal 105 and the reference potential terminal 104. The control unit 50 of the present example outputs an internal signal ST0 which controls the MOSFET in accordance with the internal state of the power supply apparatus 100.

The power supply apparatus 100 may include at least one of a diode 66 and a diode 68. The diode 66 includes an anode connected to the reference potential terminal 104 and a cathode connected to the high potential terminal 103. The diode 66 connects the high potential terminal 103 to the reference potential terminal 104 if a voltage larger than or equal to the predetermined value is input to the high potential terminal 103, thereby protecting the power supply apparatus 100.

The diode 68 includes an anode connected to the reference potential terminal 104 and a cathode connected to the input terminal 101. The diode 68 connects the input terminal 101 to the reference potential terminal 104 if a voltage larger than or equal to the predetermined value is input to the input terminal 101, thereby protecting the power supply apparatus 100.

The power supply apparatus 100 may include an internal power source 70. The internal power source 70 is connected to the high potential terminal 103. The internal power source 70 may generate a power voltage supplied to each circuit of the power supply apparatus 100 in accordance with the high potential VCC. For example, the internal power source 70 supplies a power voltage to each detection unit.

Figure 2:
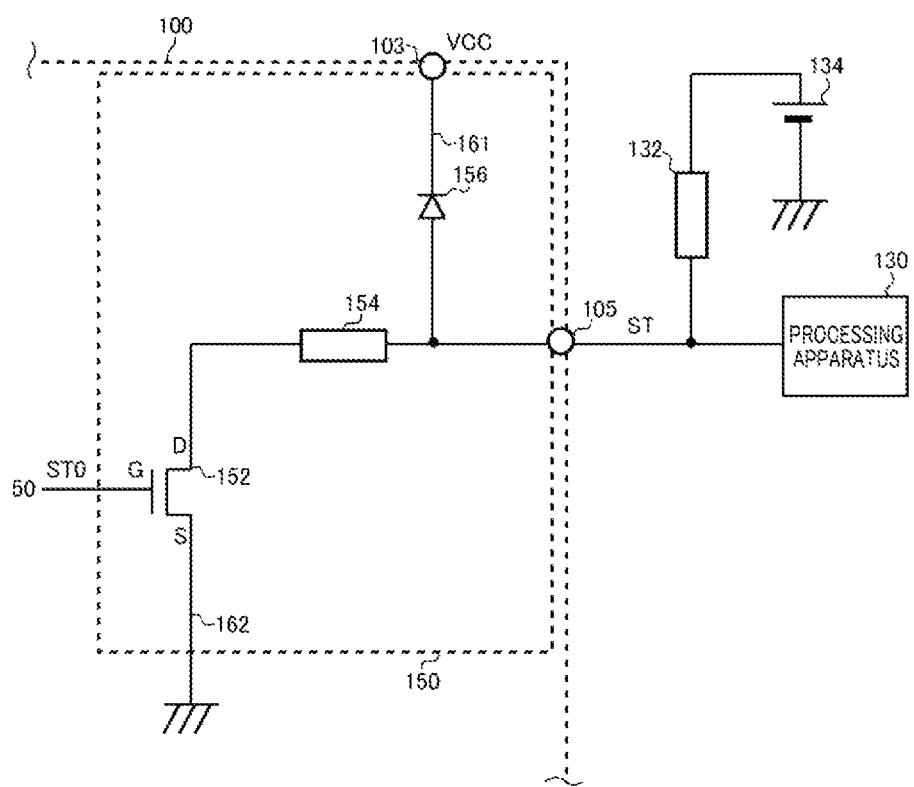
FIG. 2 is a diagram illustrating a configuration example of the state output circuit 150 according to the first comparative example.

FIG. 2 is a diagram illustrating a configuration example of the state output circuit 150 according to the first comparative example. In the present example, a pull-up power source 134 and a pull-up resistor 132 are provided outside the power supply apparatus 100. The pull-up power source 134 is connected to the state output terminal 105 via the pull-up resistor 132. This allows a potential of the state output terminal 105 to be pulled up by the pull-up power source 134. The potential of the pull-up power source 134 of the present example is lower than that of the high potential VCC.

The state output circuit 150 includes a state output terminal 105, a reference potential line 162, a high potential line 161, a connection switch unit 152, an output resistor 154 and a protection diode 156. A reference potential GND is applied to the reference potential line 162. The reference potential line 162 may be connected to the reference potential terminal 104 illustrated in FIG. 1. A high potential is applied to the high potential line 161, the potential being higher than the reference potential GND. The high potential VCC is applied to the high potential line 161 of the present example. The high potential line 161 may be connected to the high potential terminal 103.

The connection switch unit 152 is provided between the state output terminal 105 and the reference potential line 162. The connection switch unit 152 switches whether to connect the state output terminal 105 to the reference potential line 162 or not, in accordance with whether an anomalous state is detected in the control unit 50. The connection switch unit 152 of the present example is an MOSFET including a source terminal S connected to the reference potential line 162 and a drain terminal D connected to the state output terminal 105 via the output resistor 154. An internal signal ST0 is input to the gate terminal G of the connection switch unit 152.

In the present example, the state signal ST output from the state output terminal 105 has a potential in accordance with the pull-up power source 134. For example, when the connection switch unit 152 is in an ON state, the state signal ST output from the state output terminal 105 has a potential obtained by dividing the pull-up potential by the output resistor 154 and the pull-up resistor 132. In addition, when the connection switch unit 152 is in an OFF state, the state signal ST has the pull-up potential. This allows to notify the external processing apparatus 130 of the internal state of the power supply apparatus 100.

The output resistor 154 is provided between the state output terminal 105 and the connection switch unit 152. The output resistor 154 is a resistor formed of polysilicon, for example, but not limited thereto. A resistance value of the output resistor 154 ranges approximately from 10Ω to 100 kΩ.

The protection diode 156 includes an anode connected to the state output terminal 105 and a cathode connected to the high potential line 161. The protection diode 156 connects the state output terminal 105 to the high potential terminal 103 if a high potential such as a surge is applied to the state output terminal 105, thereby protecting the connection switch unit 152 or other.

In the state output circuit 150 of the present example, if the high potential VCC is 0 V, for example, much smaller than the potential of the pull-up power source 134, large currents could flow from the pull-up power source 134 to the high potential terminal 103. Thus, the state output circuit 150 cannot be protected sufficiently. Note that the pull-up potential generated by the pull-up power source 134 is preferably determined in accordance with a rated input voltage of the processing apparatus 130, for example. However, an increase of the pull-up potential of the pull-up power source 134 could facilitate a current to flow from the pull-up power source 134 to the high potential terminal 103. Thus, in the state output circuit 150 of the present example, it may be difficult to adjust the pull-up potential in accordance with the characteristics of the processing apparatus 130.

Figure 3:
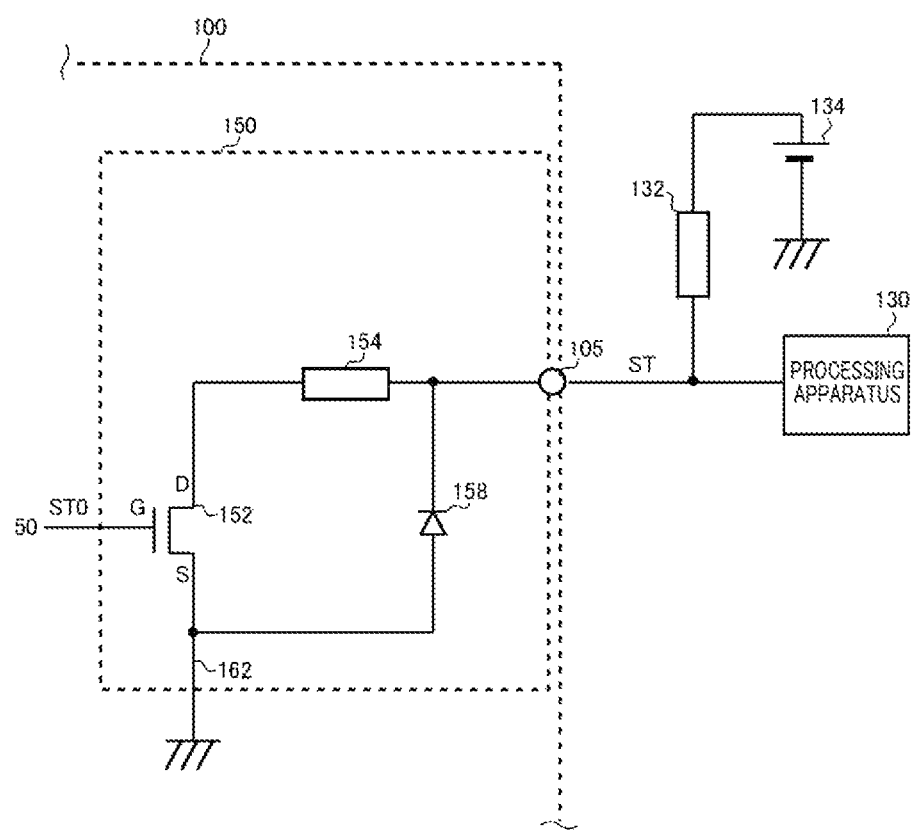
FIG. 3 is a diagram illustrating a configuration example of the state output circuit 150 according to the second comparative example.

FIG. 3 is a diagram illustrating a configuration example of the state output circuit 150 according to the second comparative example. Also in the present example, a pull-up power source 134 and a pull-up resistor 132 are provided outside the power supply apparatus 100.

The state output circuit 150 includes a protection diode 158 in place of the protection diode 156 in the configuration of the state output circuit 150 illustrated in FIG. 2. The protection diode 158 includes an anode connected to the reference potential line 162 and a cathode connected to the state output terminal 105. The protection diode 158 connects the state output terminal 105 to the reference potential line 162 if a high potential such as a surge is applied to the state output terminal 105, thereby protecting the connection switch unit 152 or other.

In the state output circuit 150 of the present example, when the state output terminal 105 has a negative potential, large currents could flow from the reference potential line 162 to the state output terminal 105 through the protection diode 156. Thus, the power consumption could be increased. Thus, the state output circuit 150 cannot be protected sufficiently. In addition, an increase of the pull-up potential of the pull-up power source 134 could facilitate a current to flow from the pull-up power source 134 to the reference potential line 162. Thus, in the state output circuit 150 of the present example, it may be difficult to adjust the pull-up potential in accordance with the characteristics of the processing apparatus 130.

Figure 4:
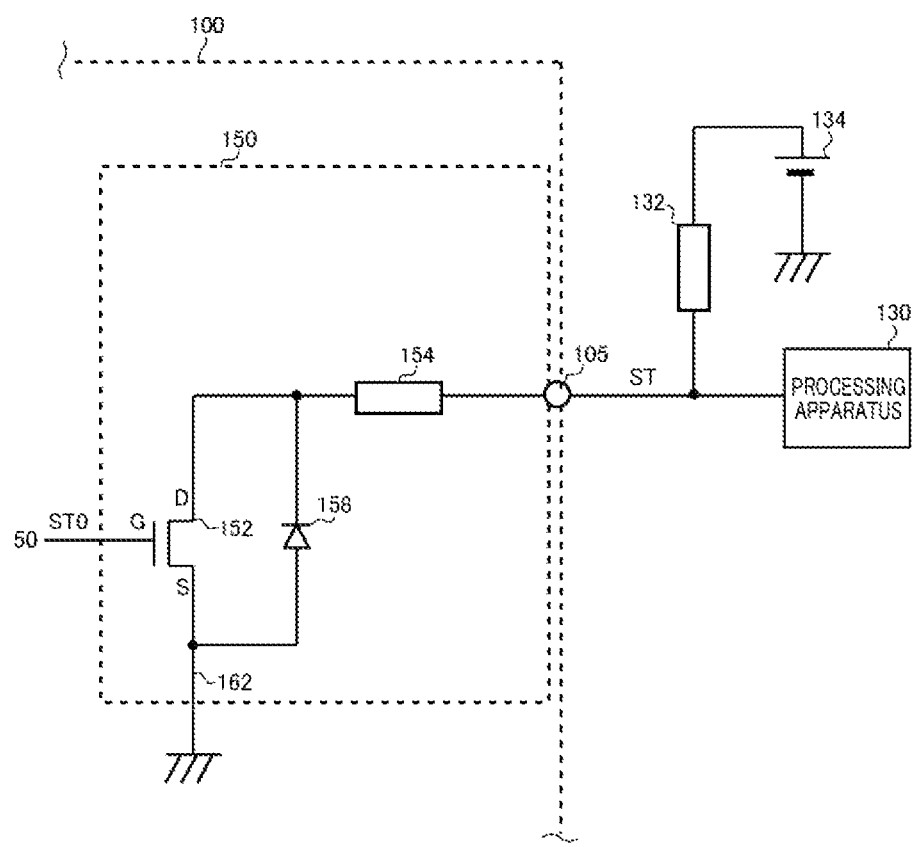
FIG. 4 is a diagram illustrating a configuration example of the state output circuit 150 according to the third comparative example.

FIG. 4 is a diagram illustrating a configuration example of the state output circuit 150 according to the third comparative example. Also in the present example, a pull-up power source 134 and a pull-up resistor 132 are provided outside the power supply apparatus 100.

In the configuration of the state output circuit 150, the cathode of the protection diode 158, as in the configuration of the state output circuit 150 illustrated in FIG. 3, is connected to the drain terminal D of the connection switch unit 152. According to the present example, the output resistor 154 is provided between the state output terminal 105 and the protection diode 158. Thus, even if the state output terminal 105 has a negative potential, a current which flows from the reference potential line 162 to the state output terminal 105 can be suppressed.

However, a resistance value of the output resistor 154 ranging approximately from 10Ω to 100 kΩ has less effect of the power saving. If the resistance value of the output resistor 154 is increased, the effect of the power saving can be enhanced. However, if the state signal ST is a logic value L, the potential of the state output terminal 105 is determined by the ratio of the voltage divided between the pull-up resistor 132 and the output resistor 154. Therefore, the potential increases in accordance with an increase in the resistance value of the output resistor 154, which results in a smaller potential difference between the logic value H and the logic value L.

Figure 5:
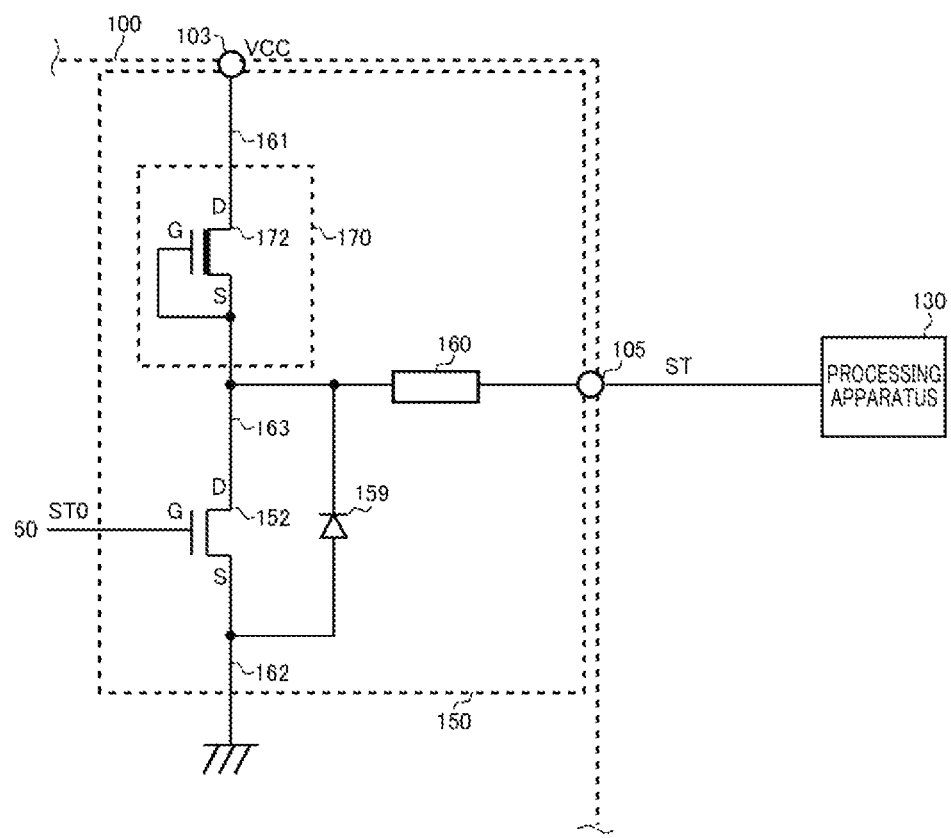
FIG. 5 is a diagram illustrating a configuration example of the state output circuit 150 according to the example.

FIG. 5 is a diagram illustrating a configuration example of the state output circuit 150 according to the example. The state output circuit 150 of the present example includes a high potential line 161, a reference potential line 162, a state output terminal 105, a connection switch unit 152, a first pull-up terminal, a first protection resistor 160, a first connection line 163, a pull-up unit 170 and a first protection diode 159. The high potential line 161, the reference potential line 162, the state output terminal 105, the connection switch unit 152 and the first protection diode 159 are the same as the high potential line 161, the reference potential line 162, the state output terminal 105, the connection switch unit 152 and the protection diode 158 illustrated in FIG. 4, respectively.

A first pull-up potential is applied to the first pull-up terminal which is a potential higher than the reference potential GND. The first pull-up terminal of the present example is the high potential terminal 103 and the first pull-up potential is the high potential VCC.

The first protection resistor 160 is provided between the connection switch unit 152 and the state output terminal 105. A resistance value of the first protection resistor 160 is larger than the resistance value of the output resistor 154 of FIG. 4. This allows a current which flows through the state output terminal 105 to be suppressed. The resistance value of the first protection resistor 160 may be 1 kΩ or more. The resistance value of the first protection resistor 160 may be 5 kΩ or more, may be 10 kΩ or more, and may also be 20 kΩ or more.

The first protection resistor 160 is a resistor formed of polysilicon or other, for example. In another example, the first protection resistor 160 may also be an MOSFET of a depletion type which includes a gate terminal and a source terminal connected to each other.

The first connection line 163 is a wiring which connects the first protection resistor 160 to the connection switch unit 152. The first connection line 163 of the present example is connected to the drain terminal of the MOSFET of the connection switch unit 152.

The pull-up unit 170 pulls up the first connection line 163 up to the first pull-up potential (high potential VCC in the present example). The pull-up unit 170 of the present example includes a pull-up resistor 172 provided between a first pull-up terminal (high potential terminal 103 in the present example) and the first connection line 163. The pull-up resistor 172 may be a resistor having a resistance value higher than that of the first protection resistor 160. The resistance value of the pull-up resistor 172 may be 10 kΩ or more, may be 50 kΩ or more, and may also be 100 kΩ or more.

The pull-up resistor 172 of the present example is an MOSFET of a depletion type which includes a source terminal S and a gate terminal G connected to each other, and a drain terminal D connected to the high potential line 161, where the source terminal S is connected to the first connection line 163. In another example, the pull-up resistor 172 may also be a resistor formed of polysilicon or other.

The pull-up unit 170 is provided between the first connection line 163 and the first pull-up terminal such that, even if the resistance value of the first protection resistor 160 is increased, an increase of the potential of the state output terminal 105 is suppressed when the state signal ST is a logic value L. In addition, even if the high potential VCC reaches around 0 V, large currents are not supplied from the outside to the state output terminal 105. In addition, use of the pull-up resistor 172 having a large resistance value can suppress a current which flows from the reference potential line 162 to the high potential line 161 through the first protection diode 159, if the high potential VCC reaches around 0 V.

The first protection diode 159 includes an anode connected the reference potential line 162 and a cathode connected the first connection line 163. The first protection diode 159 is provided such that the potential of the state signal ST can be clamped to protect the processing apparatus 130.

In the present example, the high potential terminal 103 functions as a power supply terminal which supplies power of a power source to the control unit 50. That is, the power supply terminal of the control unit 50 and the first pull-up terminal are the same terminal. This allows the number of terminals of the power supply apparatus 100 to be reduced.

Figure 6:
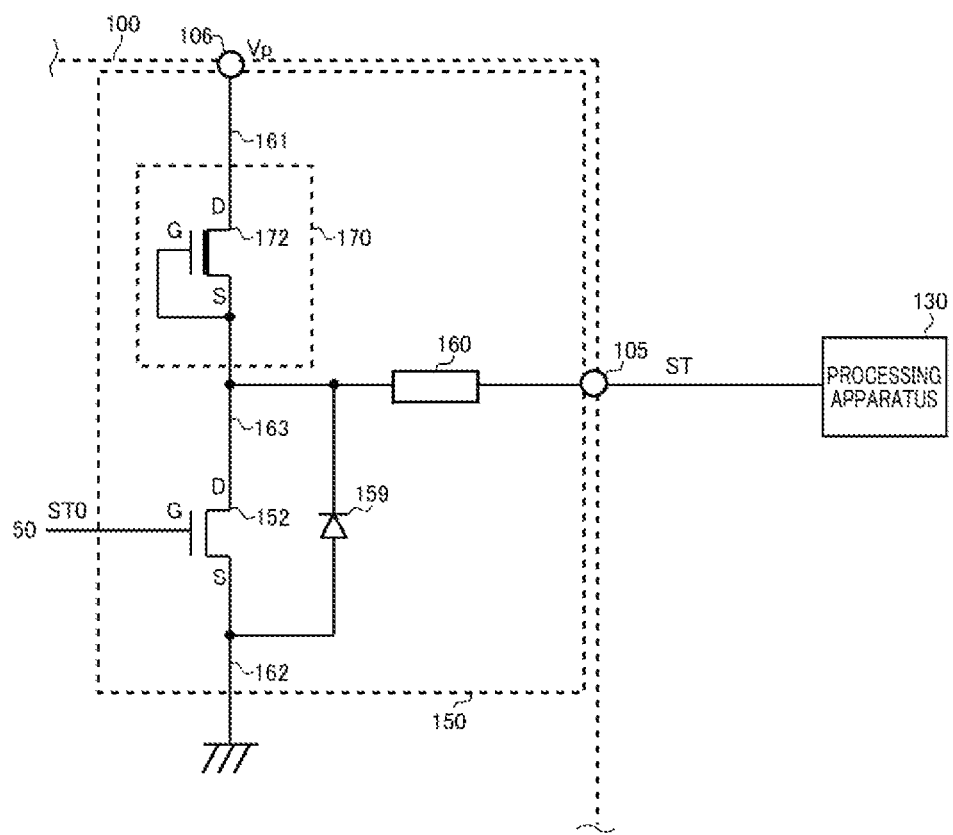
FIG. 6 is a diagram illustrating another configuration example of the state output circuit 150 according to the example.

FIG. 6 is a diagram illustrating another configuration example of the state output circuit 150 according to the example. The state output circuit 150 of the present example includes a pull-up terminal 106. The state output circuit 150 of the present example uses the pull-up terminal 106 in place of the high potential terminal 103 in the configuration illustrated in FIG. 5. The pull-up terminal 106 of the present example is one example of the first pull-up terminal. The configurations other than the pull-up terminal 106 are the same as the example illustrated in FIG. 5. The pull-up terminal 106 is a terminal different from the high potential terminal 103 which is a power supply terminal of the control unit 50. The pull-up terminal 106 of the present example is a terminal of the power supply apparatus 100.

A power source connected to the pull-up terminal 106 is different from a power source connected to the high potential terminal 103. That is, any first pull-up potential Vp can be set, independently from the high potential VCC. For example, the first pull-up potential Vp can be set in accordance with the characteristics of the processing apparatus 130. The first pull-up potential Vp may be higher than the high potential VCC. The first pull-up potential Vp of the present example is a positive potential.

Figure 7:
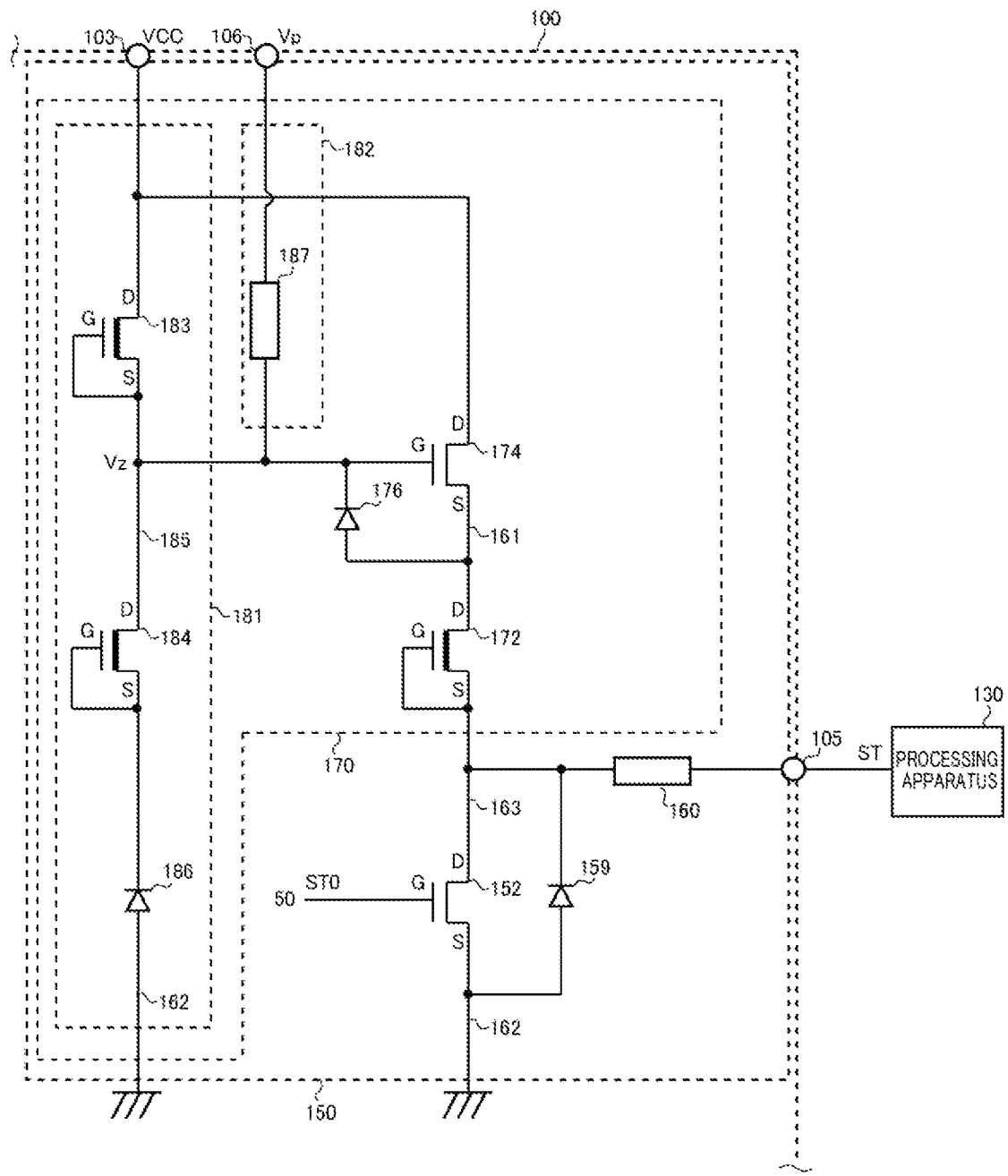
FIG. 7 is a diagram illustrating another configuration example of the state output circuit 150 according to the example.

FIG. 7 is a diagram illustrating another configuration example of the state output circuit 150 according to the example. The state output circuit 150 of the present example includes a first pull-up terminal to which the first pull-up potential is applied and a second pull-up terminal to which the second pull-up potential is applied. The pull-up unit 170 pulls up the first connection line 163 up to a potential in accordance with the first pull-up potential or the second pull-up potential. Note that the potential in accordance with the pull-up potential is a potential which varies to follow the pull-up potential if the pull-up potential varies.

In the present example, the first pull-up terminal is the high potential terminal 103 and the first pull-up potential is the high potential VCC. That is, the first pull-up terminal and the power supply terminal of the control unit 50 are the same terminal. In addition, the second pull-up terminal is the pull-up terminal 106 and the second pull-up potential is the pull-up potential Vp.

The pull-up unit 170 of the present example pulls up the first connection line 163 up to a potential in accordance with the first pull-up potential VCC, if the pull-up terminal 106 is in the open state, that is, if an external power source is not connected to the pull-up terminal 106. If an external power source is connected to the pull-up terminal 106, it pulls up the first connection line 163 up to a potential in accordance with the second pull-up potential Vp. The pull-up unit 170 may also pull up the first connection line 163 up to a potential determined by the second pull-up potential Vp and the first pull-up potential VCC, if an external power source is connected to the pull-up terminal 106.

The pull-up unit 170 of the present example includes a first connection unit 181, a second connection unit 182, a second connection line 185, a potential generating MOSFET 174, a second protection diode 176 and a pull-up resistor 172. The pull-up resistor 172 is the same as the pull-up resistor 172 illustrated in FIG. 6. That is, the pull-up resistor 172 is positioned between the first connection line 163 and the high potential line 161. The high potential line 161 of the present example is connected to the high potential terminal 103 via the potential generating MOSFET and the first connection unit 181, and connected to the pull-up terminal 106 via the potential generating MOSFET and the second connection unit 182.

The potential generating MOSFET 174 is provided between the high potential terminal 103 and the pull-up terminal 106, and the first connection line 163. The potential generating MOSFET 174 generates a potential in accordance with the first pull-up potential VCC or the second pull-up potential Vp. The drain terminal D of the potential generating MOSFET 174 is connected to the high potential terminal 103 via the first connection unit 181. The source terminal S of the potential generating MOSFET 174 is connected to the high potential line 161. The gate terminal G of the potential generating MOSFET 174 is connected to the high potential terminal 103 via the first connection unit 181, and connected to the pull-up terminal 106 via the second connection unit 182.

The first connection unit 181 includes a first serial resistor 184, a second serial resistor 183 and a clamping diode 186. The clamping diode 186 is provided between the high potential terminal 103 and the reference potential line 162. The clamping diode 186 of the present example includes an anode connected the reference potential line 162 and a cathode connected to the first serial resistor 184.

The first serial resistor 184 is provided between the clamping diode 186 and the high potential terminal 103. The first serial resistor 184 of the present example is an MOSFET of a depletion type which includes a gate terminal G and a source terminal S connected to each other. The source terminal S of the first serial resistor 184 is connected to the clamping diode 186 and the drain terminal D is connected to the second serial resistor 183.

The second serial resistor 183 is provided between the first serial resistor 184 and the high potential terminal 103. The second serial resistor 183 of the present example is an MOSFET of a depletion type which includes a gate terminal G and a source terminal S connected to each other. The source terminal S of the second serial resistor 183 is connected to the first serial resistor 184 and the drain terminal D is connected to the high potential terminal 103. In addition, the drain terminal D of the potential generating MOSFET 174 is connected to a wiring between the high potential terminal 103 and the second serial resistor 183.

The second connection line 185 is a wiring which connects the first serial resistor 184 to the second serial resistor 183. The second connection line 185 is connected to the gate terminal G of the potential generating MOSFET. The amount of drain currents which can flow through the first serial resistor 184 may be larger than that of drain currents which can flow the second serial resistor 183. That is, the channel area of the first serial resistor 184 is larger than the channel area of the second serial resistor 183. The channel area is an area of a channel of each MOSFET, in a plane perpendicular to a direction in which the drain current Id flows. In another example, the first serial resistor 184 and the second serial resistor 183 may also be a resistor formed of polysilicon or other. The resistance value of the first serial resistor 184 may be smaller than the resistance value of the second serial resistor 183. This allows a current to flow from the pull-up terminal 106 to the reference potential line 162, if an excessive voltage is applied as the second pull-up potential Vp, thereby suppressing a current which flows from the pull-up terminal 106 to the high potential terminal 103.

The second connection unit 182 may include a second protection resistor 187 provided between the pull-up terminal 106 and the gate terminal G of the potential generating MOSFET 174. The resistance value of the second protection resistor 187 may be 1 kΩ or more, may be 5 kΩ or more, may be 10 kΩ or more, and may also be 20 kΩ or more. The resistance value of the second protection resistor 187 may also be the same as the resistance value of the first protection resistor 160.

The second protection diode 176 includes an anode connected to the source terminal S of the potential generating MOSFET 174, and cathode connected to the gate terminal G of the potential generating MOSFET 174. The second protection diode 176 can suppress an excessive voltage to be applied between the gate and the source of the potential generating MOSFET 174.

If the pull-up terminal 106 is in the open state, the potential of the second connection line 185 is a potential in accordance with a clamping voltage of the clamping diode 186. In FIG. 7, the clamping voltage is indicated by Vz and the threshold voltage of the potential generating MOSFET 174 is indicated by Vth. The potential Vz is higher than the threshold voltage Vth of the potential generating MOSFET 174. If the potential generating MOSFET 174 turns to the ON state, the potential of the high potential line 161 will be Vz-Vth. Thus, the first connection line 163 can be pulled up to a potential in accordance with the first pull-up potential VCC. The threshold voltage of potential generating MOSFET 174 of the present example is approximately 1 V.

If the second pull-up potential Vp is applied to the pull-up terminal 106, the potential of the second connection line 185 is a potential obtained by subtracting a decreased voltage Vr across the second protection resistor 187 from the second pull-up potential Vp. From the pull-up terminal 106 to the high potential terminal 103, a current flows via the second protection resistor 187 and the second serial resistor 183. For example, if the resistance is 10 kΩ and the current is 15 μA in the second protection resistor 187, the decreased voltage Vr across the second protection resistor 187 is 0.15 V. If the potential generating MOSFET 174 turns to the ON state, the potential of the high potential line 161 will be Vp-Vr-Vth. Thus, the first connection line 163 can be pulled up to a potential in accordance with the second pull-up potential Vp.

Such a configuration allows the first connection line 163 to be pulled up in accordance with the first pull-up potential VCC, if an external power source is not connected to the pull-up terminal 106. In addition, if an external power source is connected to the pull-up terminal 106, the first connection line 163 can be pulled up in accordance with the second pull-up potential Vp. Thus, the state signal ST having a variety of potentials can be generated to support the processing apparatus 130 having a variety of characteristics.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: driver circuit, 12: output unit, 50: control unit, 56: load open detection unit, 58: overcurrent detection unit, 60: overheat detection unit, 66, 68: diode, 70: internal power source, 72: low voltage detection unit, 100: power supply apparatus, 101: input terminal, 102: output terminal, 103: high potential terminal, 104: reference potential terminal, 105: state output terminal, 106: pull-up terminal, 110: power source, 130: processing apparatus, 132: pull-up resistor, 134: pull-up power source, 150: state output circuit, 152: connection switch unit, 154: output resistor, 156: diode, 158: diode, 159: first protection diode, 160: first protection resistor, 161: high potential line, 162: reference potential line, 163: first connection line, 170: pull-up unit, 172: pull-up resistor, 174: potential generating MOSFET, 176: second protection diode, 181: first connection unit, 182: second connection unit, 183: second serial resistor, 184: first serial resistor, 185: second connection line, 186: clamping diode, 187: second protection resistor, 200: load

What is claimed is:

1. A state output circuit that outputs a state signal indicating a state of a power supply apparatus, the state output circuit comprising:
    a state output terminal that outputs the state signal;
    a reference potential line to which a reference potential is applied;
    a first pull-up terminal to which a first pull-up potential is applied, wherein the first pull-up potential is a potential higher than the reference potential;
    a connection switch unit that is provided between the state output terminal and the reference potential line, and switches whether to connect the state output terminal to the reference potential line or not, in accordance with the state signal;
    a first protection resistor provided between the connection switch unit and the state output terminal; and
    a pull-up unit that pulls up a first connection line between the first protection resistor and the connection switch unit up to the first pull-up potential.

2. The state output circuit according to claim 1, wherein a resistance value of the first protection resistor is 1 kΩ or more.

3. The state output circuit according to claim 1, further comprising a first protection diode that includes an anode connected to the reference potential line and a cathode connected to the first connection line.

4. The state output circuit according to claim 1, wherein the pull-up unit includes a pull-up resistor provided between the first connection line and the first pull-up terminal.

5. The state output circuit according to claim 4, wherein a resistance value of the pull-up resistor is 10 kΩ or more.

6. The state output circuit according to claim 4, wherein the pull-up resistor is an MOSFET of a depletion type that includes a gate terminal and a source terminal connected to each other.

7. The state output circuit according to claim 1 further comprising:
    a control unit that controls the connection switch unit in accordance with the state of the power supply apparatus; and
    a power supply terminal that supplies power of a power source to the control unit, wherein
    the power supply terminal and the first pull-up terminal are the same terminal.

8. The state output circuit according to claim 1, further comprising:
    a control unit that controls the connection switch unit in accordance with a state of the power supply apparatus; and
    a power supply terminal that supplies power of a power source to the control unit, wherein
    the power supply terminal is a terminal different from the first pull-up terminal.

9. The state output circuit according to claim 1, further comprising a second pull-up terminal to which a second pull-up potential is applied, wherein
    the pull-up unit pulls up the first connection line up to a potential in accordance with the first pull-up potential or the second pull-up potential.

10. The state output circuit according to claim 9, wherein the pull-up unit pulls up the first connection line up to a potential in accordance with the first pull-up potential, if the second pull-up terminal is in an open state, and pulls up the first connection line up to a potential in accordance with the second pull-up potential, if an external power source is connected to the second pull-up terminal.

11. The state output circuit according to claim 9, wherein the pull-up unit includes:
a potential generating MOSFET that is provided between the first pull-up terminal and the second pull-up terminal, and the first connection line, and generates a potential in accordance with the first pull-up potential or the second pull-up potential;
a first connection unit that connects the first pull-up terminal to a gate terminal of the potential generating MOSFET; and
a second connection unit that connects the second pull-up terminal to a gate terminal of the potential generating MOSFET, wherein
the second connection unit includes a second protection resistor provided between the second pull-up terminal and a gate terminal of the potential generating MOSFET.

12. The state output circuit according to claim 11, wherein a resistance value of the second protection resistor is 1 kΩ or more.

13. The state output circuit according to claim 11, wherein the first connection unit includes:
a clamping diode provided between the first pull-up terminal and the reference potential line;
a first serial resistor provided between the clamping diode and the first pull-up terminal; and
a second serial resistor provided between the first serial resistor and the first pull-up terminal, wherein
a second connection line between the first serial resistor and the second serial resistor is connected to a gate terminal of the potential generating MOSFET.

14. The state output circuit according to claim 11, wherein the pull-up unit further includes a second protection diode including an anode connected to a source terminal of the potential generating MOSFET and a cathode connected to a gate terminal of the potential generating MOSFET.

15. A power supply apparatus that supplies power to a load, the power supply apparatus comprising:
a control unit that detects a state of the power supply apparatus; and
the state output circuit according to claim 1 that outputs a state signal indicating a state of the power supply apparatus.

* * * * *